United States Patent
Guo et al.

(10) Patent No.: US 12,329,020 B2
(45) Date of Patent: Jun. 10, 2025

(54) DISPLAY SUBSTRATE, MANUFACTURING METHOD THEREOF AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Yuanzheng Guo, Beijing (CN); Yunhao Wang, Beijing (CN); Yongzhan Han, Beijing (CN); Jie Li, Beijing (CN); Yanqiang Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 529 days.

(21) Appl. No.: 17/763,187

(22) PCT Filed: May 24, 2021

(86) PCT No.: PCT/CN2021/095535
§ 371 (c)(1),
(2) Date: Mar. 23, 2022

(87) PCT Pub. No.: WO2021/238872
PCT Pub. Date: Dec. 2, 2021

(65) Prior Publication Data
US 2022/0359633 A1     Nov. 10, 2022

(30) Foreign Application Priority Data
May 26, 2020 (CN) .......................... 202010456514.3

(51) Int. Cl.
*H10K 71/00* (2023.01)
*H10K 50/86* (2023.01)
(Continued)

(52) U.S. Cl.
CPC ....... *H10K 59/8792* (2023.02); *H10K 50/865* (2023.02); *H10K 59/124* (2023.02);
(Continued)

(58) Field of Classification Search
CPC .... H10K 59/124; H10K 50/865; H10K 71/00; H10K 59/1201; H10K 2102/351; H10K 59/8792; H10K 59/122; H10K 59/80518
See application file for complete search history.

(56) References Cited

U.S. PATENT DOCUMENTS

| | | | |
|---|---|---|---|
| 2002/0043928 A1* | 4/2002 | Cho | H10K 59/80523 313/506 |
| 2002/0050958 A1 | 5/2002 | Matthies | |
| 2007/0014991 A1 | 1/2007 | Mardilovich | |

FOREIGN PATENT DOCUMENTS

| | | |
|---|---|---|
| CN | 104979372 A | 10/2015 |
| CN | 110277507 A | 9/2019 |

(Continued)

OTHER PUBLICATIONS

China Patent Office, First Office Action issued Aug. 5, 2022 for application No. CN202010456514.3.

*Primary Examiner* — Elias Ullah
(74) *Attorney, Agent, or Firm* — HOUTTEMAN LAW LLC (57) ABSTRACT

The present disclosure provides a display substrate, a manufacturing method thereof and a display apparatus, belongs to the field of display technology, and can solve the problems such as low optical densities of currently available anti-reflection layers and difficulties in the alignment of an
(Continued)

anti-reflection layer with a reflective anode. The display substrate according to the present disclosure has a pixel region and a non-pixel region, and includes a base substrate and a reflective anode on the base substrate, and further includes an anti-reflection layer on the reflective anode and configured to correspond to the non-pixel region; the anti-reflection layer includes a transparent polymer layer and a light-absorbing material; a surface of the transparent polymer layer away from the base substrate is provided with a plurality of micro-pores; and the plurality of micro-pores are filled with the light-absorbing material.

18 Claims, 4 Drawing Sheets

(51) Int. Cl.
  *H10K 59/124* (2023.01)
  *H10K 59/80* (2023.01)
  H10K 59/12 (2023.01)
  H10K 102/00 (2023.01)

(52) U.S. Cl.
  CPC ......... *H10K 71/00* (2023.02); *H10K 59/1201* (2023.02); *H10K 59/80518* (2023.02); *H10K 2102/351* (2023.02)

(56) References Cited

FOREIGN PATENT DOCUMENTS

| | | | |
|---|---|---|---|
| CN | 111048685 | A | 4/2020 |
| CN | 111584752 | A | 8/2020 |
| JP | 2014002928 | A | 1/2014 |

* cited by examiner

| VFR Ratio | Photo | Microscopic image | | Micro-pore depth | Porosity |
|---|---|---|---|---|---|
| CF4:O2 5:1 | | | | 10-30nm | 2-5% |
| O2 0sccm | | | | 0 | 0 |
| CF4:O2 2:1 | | | | 350-380nm | 25%-35% |

DISPLAY SUBSTRATE, MANUFACTURING METHOD THEREOF AND DISPLAY APPARATUS

CROSS-REFERENCE TO RELATED APPLICATIONS

The present disclosure claims the priority of the Chinese Patent Application No. 202010456514.3 filed on May 26, 2020, the entire contents of which are incorporated herein by reference.

TECHNICAL FIELD

The present disclosure belongs to the field of display technology, and particularly, relates to a display substrate, a manufacturing method thereof and a display apparatus.

BACKGROUND

Organic light-emitting diode (OLED) display devices have been extensively used in the display field due to their advantages of high brightness, high reliability and the like. In an OLED display device, a metal layer having a reflective function is typically used as a reflective anode of the device to reflect light rays generated by an organic functional layer. However, in an outdoor or strong light environment, ambient light rays are also reflected by the reflective anode, which very likely results in a decrease in display contrast of a display panel, thereby greatly affecting the display effect and reducing a user's experience outdoors. At present, in order to alleviate the reflection of the ambient light rays by the reflective anode, a pixel definition layer is typically formed by using a black material.

SUMMARY

The present disclosure provides a display substrate, a manufacturing method thereof and a display apparatus.

The display substrate has a pixel region and a non-pixel region, and includes a base substrate and a first electrode layer situated on the base substrate; the display substrate further includes an anti-reflection layer situated on the first electrode layer, and an orthographic projection of the anti-reflection layer on the base substrate is within the non-pixel region;

the anti-reflection layer includes a transparent polymer layer and a light-absorbing material; and
a surface of the transparent polymer layer away from the base substrate is provided with a plurality of micro-pores; and the plurality of micro-pores are filled with the light-absorbing material.

In one embodiment, the anti-reflection layer is situated on a side of the first electrode layer away from the base substrate.

In one embodiment, a depth of each of the plurality of micro-pores ranges from 350 nanometers to 400 nanometers.

In one embodiment, a material of the transparent polymer layer includes a photoresist.

In one embodiment, the light-absorbing material includes molybdenum, titanium or aluminum.

In one embodiment, the display substrate further includes a thin-film transistor situated on the base substrate and a planarization layer situated on the thin-film transistor;

the thin-film transistor includes: an active layer, a gate insulation layer, a gate electrode, an interlayer dielectric layer, a source electrode and a drain electrode situated on the base substrate in this order; the active layer includes a first contact region, a second contact region and a channel region situated between the first contact region and the second contact region; the source electrode and the drain electrode are provided in an identical layer and connected to the first contact region and the second contact region of the active layer through a first via and a second via penetrating through the interlayer dielectric layer and the gate insulation layer, respectively; and the planarization layer is situated between the identical layer where the source electrode and the drain electrode are situated and the first electrode layer, a third via is provided in the planarization layer and is situated at a position corresponding to the drain electrode, and the first electrode layer is connected to the drain electrode through the third via.

In one embodiment, the display substrate further includes a pixel definition layer situated on the anti-reflection layer, an organic functional layer situated on the pixel definition layer and configured to correspond to the pixel region, a second electrode layer situated on the organic functional layer and configured to be opposite to the first electrode layer, and an encapsulation layer situated on the second electrode layer.

In one embodiment, a shape of each of the plurality of micro-pores is a column shape or a T shape.

In one embodiment, a portion of the surface of the transparent polymer layer away from the base substrate, which is not provided with a plurality of micro-pores, does not include the light-absorbing material.

In one embodiment, a porosity of the plurality of micro-pores in the transparent polymer layer ranges from 25% to 35%.

The display apparatus according to the present disclosure includes the display substrate as described above.

There is provided a manufacturing method of a display substrate according to the present disclosure, the display substrate has a pixel region and a non-pixel region, and the manufacturing method includes:

forming, by a patterning process, a transparent polymer layer having a preset pattern, on a base substrate where a first electrode layer is formed, such that an orthographic projection of the transparent polymer layer on the base substrate is within the non-pixel region;

forming a plurality of micro-pores by treating a surface of the transparent polymer layer away from the base substrate with a first reactive gas and a second reactive gas;

depositing a light-absorbing material on the transparent polymer layer and in the plurality of micro-pores; and removing, by an etching process, a portion of the light-absorbing material on the transparent polymer layer to form an anti-reflection layer.

In one embodiment, the first reactive gas includes carbon tetrafluoride and the second reactive gas includes oxygen.

In one embodiment, a ratio of a volumetric flow rate (VFR) of the carbon tetrafluoride to a volumetric flow rate (VFR) of the oxygen ranges from 2:1 to 5:1.

In one embodiment, the volumetric flow rate (VFR) of the carbon tetrafluoride is between 250 sccm and 350 sccm, and the volumetric flow rate (VFR) of the oxygen is between 100 sccm and 200 sccm.

In one embodiment, the manufacturing method further includes: forming, on the anti-reflection layer, a pixel definition layer to define the pixel region; forming an organic functional layer on the pixel definition layer and at a position corresponding to the pixel region; forming a second electrode layer on the organic functional layer and at a position corresponding to the first electrode layer; and forming an encapsulation layer on the second electrode layer.

DETAILED DESCRIPTION OF THE EXEMPLARY EMBODIMENTS

In order to enable a person skilled in the art to better understand the technical solutions of the present disclosure, a detailed description will hereinafter be given to the present disclosure, with reference to the accompanying drawings and embodiments.

The inventor has found that the following problems at least exist in the prior art: at present, a black material used in a pixel definition layer has a relatively low optical density, and therefore, its anti-reflection efficiency is limited; moreover, in the process of forming a display device, it is necessary to align a region defined by the pixel definition layer, and however, since the black material forming the pixel definition layer is not transparent and most of the current exposure machines are not equipped with an infrared alignment device, difficulties very likely arise during the alignment.

In the related art, a display substrate typically has a pixel region and a non-pixel region; a display device is provided in the pixel region, and a thin-film transistor is provided in the non-pixel region; a drain electrode of the thin-film transistor is connected to an anode of the display device, such that the thin-film transistor and the display device are connected in series; and the display device may be controlled to be turned on and off for display by controlling the turning on and off of the thin-film transistor. Specifically, the display device may be a top-emitting OLED or a bottom-emitting OLED. In a case where the display device is the top-emitting OLED, an anode thereof may be a reflective anode made out of a metal layer, a cathode thereof may be a transparent cathode, and light rays generated by an organic functional layer in the display device are emitted through the transparent cathode after being reflected by the reflective anode. In practical applications, in order to connect the reflective anode in the display device to the drain electrode of the thin-film transistor, an area of the reflective anode is often made relatively large, and as such, in an outdoor or strong light environment, ambient light rays are liable to be reflected by the reflective anode to the pixel region, thereby reducing the display contrast and affecting the display effect. At present, in order to alleviate the reflection of the ambient light rays by the reflective anode, a black material is typically used to form a pixel definition layer. However, currently used black materials have relatively low optical densities, and therefore, their anti-reflection efficiency is limited. Moreover, in the process of forming the display device, it is necessary to align a region defined by the pixel definition layer; however, since the black material forming the pixel definition layer is not transparent and most of the current exposure machines are not equipped with an infrared alignment device, difficulties very likely arise during the alignment. In order to solve at least one of the above technical problems in the prior art, embodiments of the present disclosure provide a display substrate, a manufacturing method thereof and a display apparatus, a detailed description of which will hereinafter be made with reference to the accompanying drawings and the embodiments.

Figure 1A:
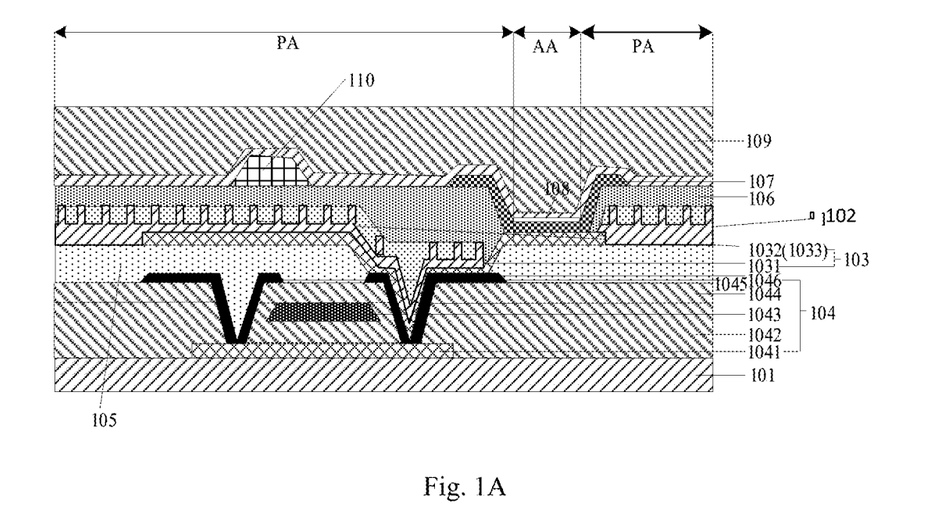
FIG. 1A shows a schematic view of a structure of a display substrate provided in an embodiment of the present disclosure.

FIG. 1A is a schematic view of a structure of a display substrate provided in an embodiment of the present disclosure. As shown in FIG. 1A, in one embodiment of the present disclosure, the display substrate has a pixel region AA and a non-pixel region PA. The display substrate includes a base substrate 101 and a first electrode layer 102 situated on the base substrate 101, and further includes an anti-reflection layer 103 situated on the first electrode layer 102 and corresponding to the non-pixel region PA, that is, an orthographic projection of the anti-reflection layer 103 on the base substrate 101 being within the non-pixel region PA; the anti-reflection layer 103 includes a transparent polymer layer 1031 and a light-absorbing material 1032; a surface of the transparent polymer layer 1031 away from the base substrate 101 is provided with a plurality of micro-pores 1033; and the plurality of micro-pores 1033 is filled with the light-absorbing material 1032.

In the display substrate provided in the embodiment of the present disclosure, the anti-reflection layer 103 is made up of the transparent polymer layer 1031 and the light absorbing material 1032. The plurality of micro-pores 1033 of the transparent polymer layer 1031 may be filled with the light absorbing material 1032. The optical density (abbreviated as "OD") of the anti-reflection layer 103 may be adjusted by selecting the light-absorbing material 1032 with higher light-absorbing performance and by controlling depths of the plurality of micro-pores 1033, such that the anti-reflection layer 103 will have a higher optical density, which can improve the anti-reflection efficiency and the light-blocking performance thereof, and therefore prevent the ambient light rays from being reflected by the first electrode layer 102 to the pixel region AA in the display substrate and hence affecting the display effect. Furthermore, during the manufacturing process of the anti-reflection layer 103 composed of the transparent polymer layer 1031 and the light-absorbing material 1032 filling the plurality of micro-pores 1033, the transparent polymer layer 1031 may be first formed on the first electrode layer 102. Since the transparent polymer layer 1031 is a transparent structure, a region to be covered by the transparent polymer layer 1031 can be determined simply by observation, so as to align the transparent polymer layer 1031 in the anti-reflection layer 103 with the first electrode layer 102. Next, the plurality of micro-pores 1033 is filled with the light-absorbing material 1032 to form the anti-reflection layer 103. Therefore, it is unnecessary to use an alignment apparatus to align the anti-reflection layer 103 with the first electrode layer 102, which can avoid the difficulties resulting from the first electrode layer 102 being blocked by the black material during alignment. The first electrode layer 102, for example, may be a reflective anode.

In some embodiments, the reflective anode is situated on a side of the first electrode layer 102 away from the base substrate 101.

Specifically, in practical applications, the anti-reflection layer 103 may cover a side of the first electrode layer 102 away from the base substrate 101, such that the anti-reflection layer 103 can block a position corresponding to the non-pixel region PA in the first electrode layer 102, which can prevent the ambient light rays from being reflected by the first electrode layer 102 to the pixel region AA in the display substrate and hence affecting the display effect.

Figure 1B:
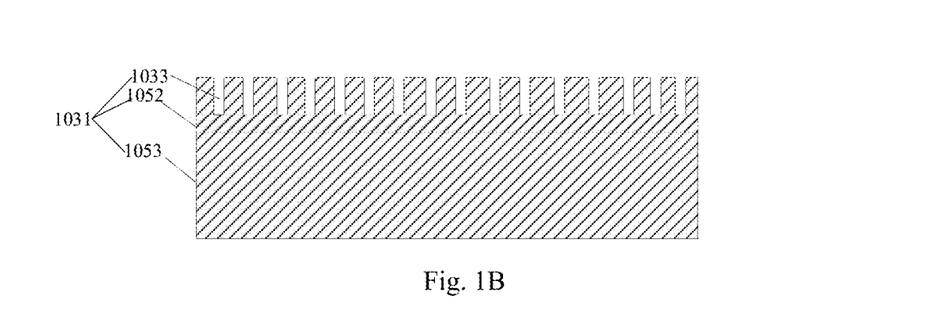
FIGS. 1B and 1C each show a schematic view of a structure of an anti-reflection layer of the display substrate of FIG. 1A according to an embodiment of the present disclosure.
Figure 1C:
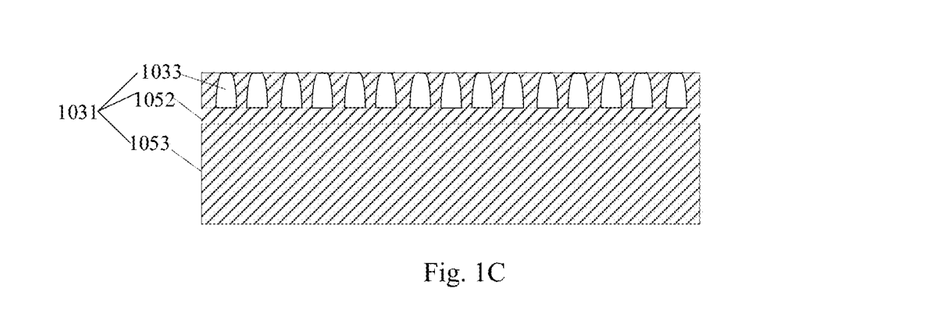

FIGS. 1B and 1C each show a schematic view of a structure of an anti-reflection layer in a display panel according to an embodiment of the present disclosure.

In some embodiments, a depth of each micro-pore 1033 of the transparent polymer layer 1031 may be configured to be 350 to 400 nanometers, and a thickness of a portion of the transparent polymer layer 1031 not provided with any micro-pore 1033 is around 950 nanometers, such that a side of the transparent polymer layer 1031 away from the first electrode layer 102 constitutes a plurality of column-shaped structures (similar to a grass-like structure as shown in FIG. 1B) or a plurality of T-shaped structures (as shown in FIG. 1C) to accommodate a sufficient amount of the light-absorbing material 1032, and the optical density of the anti-reflection layer 103 thus formed can reach around 1.0, that is, luminous transmittance of the anti-reflection layer 103 is around 10%, whereby it can be assured that the anti-reflection layer 103 has good light-blocking performance for the first electrode layer 102, and therefore the ambient light rays can be prevented from being reflected by the first electrode layer 102 to the pixel region AA in the display substrate and hence affecting the display affect. Furthermore, it is to be noted that whether the micro-pore 1032 is of the column-shaped structure or the T-shaped structure depends on a material of the transparent polymer layer 1031, which will be explained in detail in subsequent embodiments.

In some embodiments, the material of the transparent polymer layer 1031 includes a photoresist.

It is to be noted that the material of the transparent polymer layer 1031 may be the photoresist, which is a transparent material; a photoresist layer may be formed on the first electrode layer 102 by coating the photoresist thereupon, and since the photoresist layer thus formed is transparent, a position of the first electrode layer 102 can be clearly observed, whereby a specific position to be patterned in the photoresist layer can be accurately determined. Thereafter, the photoresist layer is patterned by means of exposure and development, so as to expose a region of the first electrode layer 102 corresponding to the pixel region 102 in order to form other film layers of the display device in the display substrate afterwards. Specifically, in practical applications, the photoresist may be a negative photoresist named E1-804, which is produced by Japan Synthetic Rubber Co., Ltd., or may be chosen from other types of photoresists, which will not be enumerated herein. In the case of the photoresist E1-804 from Japan Synthetic Rubber Co., Ltd., the micro-pore 1033 may be formed into the column-shaped structure, whereas in the case of other types of photoresists, the micro-pore 1033 may be formed into the T-shaped structure; or, the micro-pore 1033 may be formed into different shapes using E1-804 under different process conditions. In the present disclosure, the shape of the micro-pore 1033 is not specifically limited, provided that the micro-pore1033 can accommodate the light-absorbing material 1032 as much as possible. It is to be understood that according to practical needs, the photoresist may be selected from photoresists with different properties, such as positive or negative photoresists, which are not limited herein.

In some embodiments, the light-absorbing material 1032 includes molybdenum, titanium or aluminum.

It is to be noted that the light-absorbing material 1032 may be selected from metal materials such as molybdenum, titanium, aluminum and the like, and these metal materials will appear black or gray after having reached a certain thickness, which can enable them to absorb light. In practical applications, the light-absorbing material 1032 filling the plurality of micro-pores 1033 may be one or more of molybdenum, titanium, aluminum and the like. It is to be understood that in addition to the metal materials described above, the light-absorbing material 1032 may also be one or more other metal materials having a light-absorbing property. Furthermore, it is to be noted that the light-absorbing material 1032 in some embodiments of the present disclosure may alternatively be any non-metal material having a light-absorbing property, which will not be enumerated herein.

In some embodiments, as shown in FIG. 1A, the display substrate further includes: a thin-film transistor 104 on the base substrate 101 and a planarization layer 105. The thin-film transistor 104 includes: an active layer 1041, a gate insulation layer 1042, a gate electrode 1043, an interlayer dielectric layer 1044, a source electrode 1045 and a drain electrode1046 successively placed on the base substrate 101. The active layer 1041 includes a first contact region, a second contact region and a channel region between the first contact region and the second contact region. The source electrode 1045 and the drain electrode1046 are provided in an identical layer, and are connected to the first contact region and the second contact region in the active layer 104 through a first via and a second via penetrating through the interlayer dielectric layer 1044 and the gate insulation layer 1042, respectively. The planarization layer 105 is situated between the identical layer where the source electrode 1045 and the drain electrode1046 are situated and the first electrode layer 102, and a third via is provided in the planarization layer 105 and at a position corresponding to the drain electrode 1046; and the first electrode layer 102 is connected to the drain electrode 1046 through the third via.

It is to be noted that in practical applications, the channel region in the active layer 1041 under the gate electrode 1043 may be made conductive by inputting a high level signal or a low level signal to the gate electrode 1043 of the thin-film transistor 104, which will result in the conduction between the source electrode 1045 and the drain electrode1046 of the thin-film transistor104 so as to provide an electrical signal to the first electrode layer 102 in the display device. It is to be understood that the thin-film transistor 104 may be a P-type or N-type thin-film transistor, and the specific type of the thin-film transistor 104 is related to the doping type of the channel region. If the thin-film transistor104 is the P-type thin-film transistor, a signal for controlling the conduction between the source electrode 1045 and the drain electrode 1046 of the thin-film transistor 104 is the low level signal; and if the thin-film transistor 104 is the N-type thin-film transistor, the signal for controlling the conduction between the source electrode 1045 and the drain electrode 1046 of the thin-film transistor 104 is the high level signal. It is to be understood that in the thin-film transistor 104, the function of the source electrode 1045 is identical with that of the drain electrode 1046; and if one of the two electrodes is the source electrode, the other is the drain electrode, and they are interchangeable with each other. In some embodiments of the present disclosure, if the gate electrode 1043 is situated above the active layer 1041, the thin-film transistor 104 is a top-gate thin-film transistor; of course, the active layer 1041 may alternatively be provided above the gate electrode 1043, which will form a bottom-gate thin-film transistor; and specifically, the thin-film transistor to be used may be selected and manufactured according to practical needs. The planarization layer 105 may cover the source electrode 1045 and the drain electrode1046 of the thin-film transistor 104 to realize planarization thereof, thereby facilitating the manufacturing and lamination of film layers thereupon. Specifically, a material of the planarization layer 105 may be a plastic material such as organic resin or the like In some embodiments, as shown in FIG. 1A, the display substrate further includes: a pixel definition layer 106 situated on the anti-reflection layer 103, an organic functional layer 107 situated on the pixel definition layer 106 and configured to correspond to the pixel region AA, a second electrode layer 108 situated on the organic functional layer 107 and configured to be opposite to the first electrode layer 102, and an encapsulation layer 109 situated on the second electrode layer 108. The second electrode layer 108, for example, may be a transparent cathode.

It is to be noted that the pixel definition layer 106 may define a position where the display device is to be formed in the display substrate, so as to form various film layers of the display device in the region defined by the pixel definition layer 106. The organic functional layer 107 may include a luminescent layer. Under the effect of an electrical signal, the luminescent layer, depending on its material, may be caused to emit light rays of a color as needed, such as red, green or blue, to realize the display function. The color of the light rays emitted by the luminescent layer is related to the material by which it is formed. In addition to the luminescent layer, the organic functional layer 107 may further include a hole injection layer and a hole transport layer between the luminescent layer and the first electrode layer 102, an electron transport layer and an electron injection layer above the luminescent layer, and other film layers. The second electrode layer 108 is configured to be opposite to the first electrode layer 102, and when the electrical signal is being applied between the second electrode layer 108 and the first electrode layer 102, electron-hole pairs may be generated in the organic functional layer 107 to excite an optical material to emit light rays, and the light rays may then be reflected by the first electrode layer 102 and transmitted through the second electrode layer 108 to realize the light-emission and display functions. The encapsulation layer 109 may encapsulate various film layers in the display device and protect the film layers by preventing water vapor and oxygen from entering them. It is to be understood that the display substrate may further include film layers such as a passivation layer, spacers and the like; and as these film layers may be manufactured using materials and processes in the related art, and have the same functions and are based on the same principles as those in the prior art, their description is omitted herein.

In one embodiment of the present disclosure, there is provided a display apparatus, which includes the display substrate provided in the foregoing embodiments; and specifically, the display apparatus may be a cell phone, a tablet computer, a smart television or any other terminal apparatus having a display function, and may be realized based on principles similar to those for realizing the display substrate provided in the foregoing embodiments, which will not be repeated herein.

Figure 2:
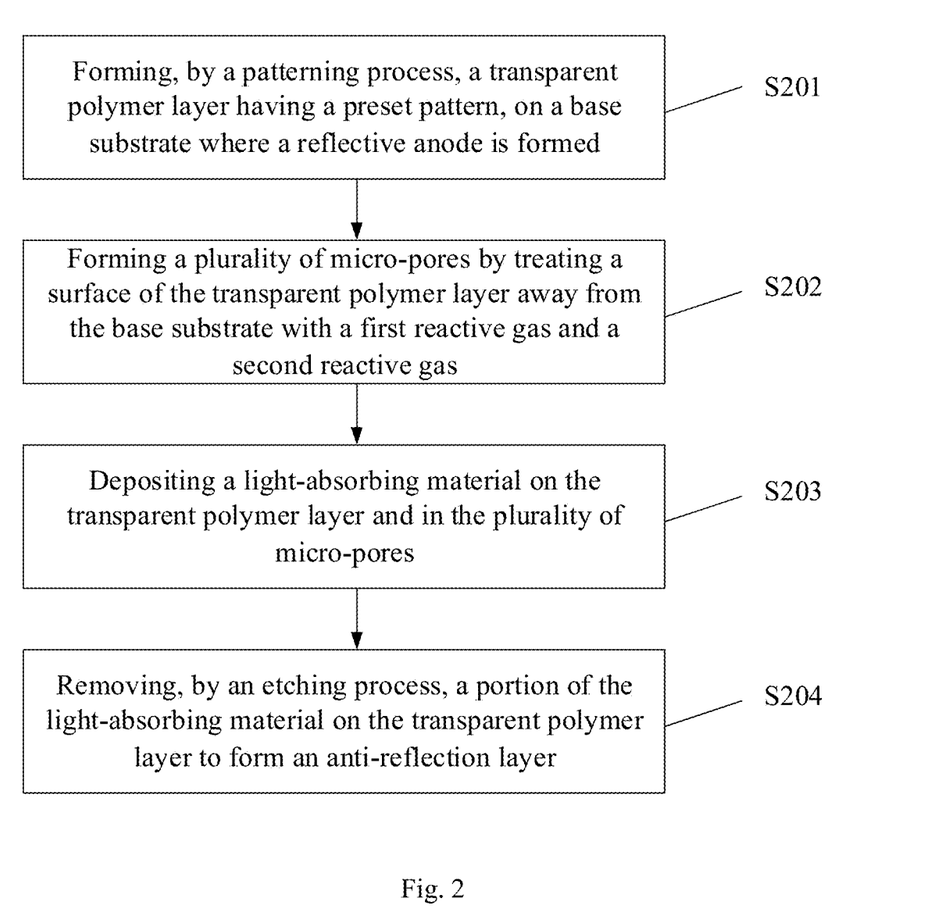
FIG. 2 shows a flow chart of a manufacturing method of a display substrate provided in an embodiment of the present disclosure.

An embodiment of the present disclosure further provides a manufacturing method of a display substrate, a flow chart of which is shown in FIG. 2. As shown in FIG. 2, the manufacturing method of the display substrate includes the following steps:

Step S201: Forming, by a patterning process, a transparent polymer layer having a preset pattern, on a base substrate 101 where a first electrode layer 102 (e.g., a reflective anode) is formed.

Figure 3A:
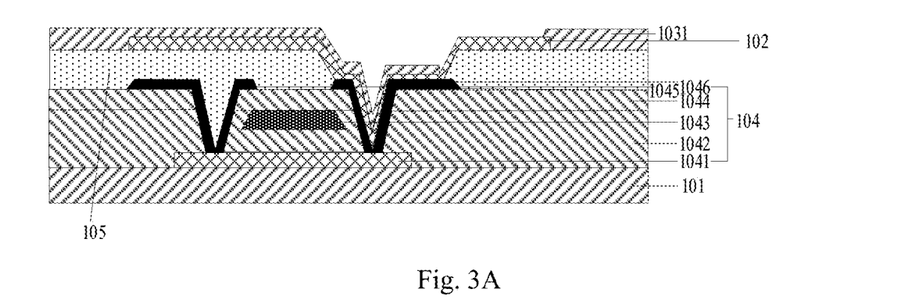
FIGS. 3A to 3D each show a schematic view of a structure corresponding to a step of forming an anti-reflection layer in a manufacturing method of a display substrate provided in an embodiment of the present disclosure.

It is to be noted that, as shown in FIG. 3A, various film layers of a thin-film transistor may be formed on the base substrate 101 and a planarization layer 105 may be formed on the thin-film transistor. Thereafter, the first electrode layer 102 is formed, and it may be connected to a drain electrode 1046 of the thin-film transistor. Thereafter, the transparent polymer layer, which may be a photoresist, is coated onto the first electrode layer 102, and the transparent photoresist is patterned through processes such as exposure, development and the like, thereby exposing a region that is situated in the first electrode layer 102 and corresponds to a pixel region AA, in order to form other film layers in a display device afterwards. Specifically, in practical applications, the photoresist in some embodiments of the present disclosure may be a negative photoresist named E1-804, which is produced by Japan Synthetic Rubber Co., Ltd., or may be selected from other types of photoresists, which will not be enumerated herein. It is to be understood that according to practical needs, the photoresist may be selected from photoresists with different properties, such as positive or negative photoresists, which are not limited herein.

Step S202: Forming a plurality of micro-pores by treating a surface of the transparent polymer layer away from the base substrate 101 with a first reactive gas and a second reactive gas.

Figure 3B:
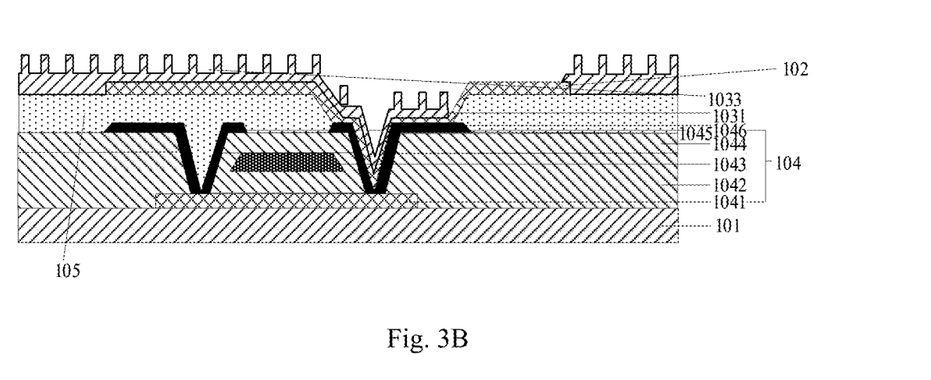

It is to be noted that, as shown in FIG. 3B, the first reactive gas and the second reactive gas are injected into a sealed environment according to a certain ratio of their respective volumetric flow rates (VFRs), such that the surface of the transparent polymer layer is etched by the second reactive gas in the sealed environment, which, for example, may be similar to a Descum process. Since the first reactive gas, which has no effect on the transparent polymer layer, is doped in a gas mixture of the first reactive gas and the second reactive gas, the effect of the gas mixture on the surface of the transparent polymer layer is by no means uniform, and as a result, the surface of the transparent polymer layer is uneven, thereby forming a plurality of column-shaped structures (e.g., a grass-like structure as shown in FIG. 1B) or a plurality of T-shaped structures (as shown in FIG. 1C), that is, a plurality of micro-pores. Depths of the plurality of micro-pores may be determined and controlled by the ratio of respective volumetric flow rates (VFRs) of the first reactive gas and the second reactive gas. As shown in FIG. 1B, the transparent polymer layer 1031 then includes a first portion 1053 which is untreated and has a thickness of around 945 nanometers; a second portion 1052 which is partially treated, may have the function of blocking, acts as a transition region, has no micro-pore 1033 formed therein, and may have a thickness of 127 nanometers; and a third portion 1033 which has the plurality of micro-pores 1033 formed therein after the treatment, and may have a thickness of around 335 nanometers. Depending on different process conditions, it is possible to alternatively form the micro-pores 1033 similar to the T-shape structures shown in FIG. 1C, wherein a portion of each micro hole 1033 away from the base substrate 101 has a relatively small width and a portion of the micro-pore 1033 close to the base substrate 101 has a relatively large width. In other words, the transparent polymer layer according to the present disclosure includes a base portion in which no micro-pore is formed, a micro-pore portion in which a plurality of micro-pores are formed, and a transition portion which is situated between the base portion and the micro-pore portion, is made of the same material as that of the base portion, has a rough surface, and does not include any micro-pore.

Step S203: Depositing a light-absorbing material on the transparent polymer layer and in the plurality of micro-pores.

Figure 3C:
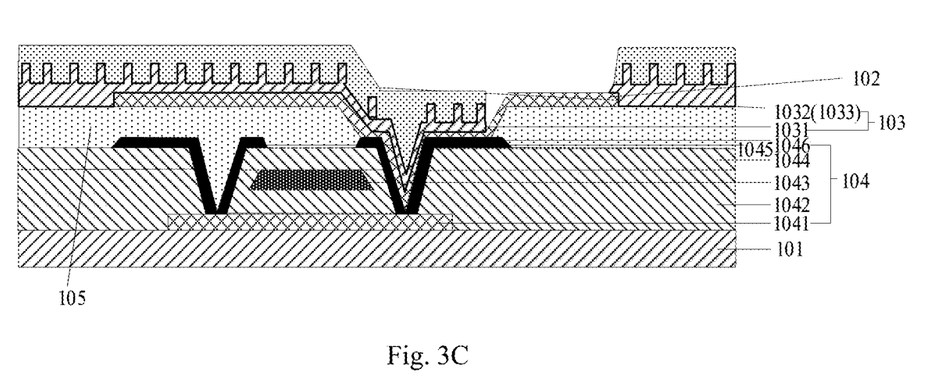

As shown in FIG. 3C, the light-absorbing material is deposited on the transparent polymer layer and in the plurality of micro-pores (e.g., using a conventional plasma vapor deposition process) to form an entire layer of light-absorbing material, and when there is a sufficient amount of the light-absorbing material, the transparent polymer layer, which was transparent originally, appears black or gray, thereby enabling it to absorb light.

Step S204: Removing a portion of the light-absorbing material on the transparent polymer layer using an etching process.

Figure 3D:
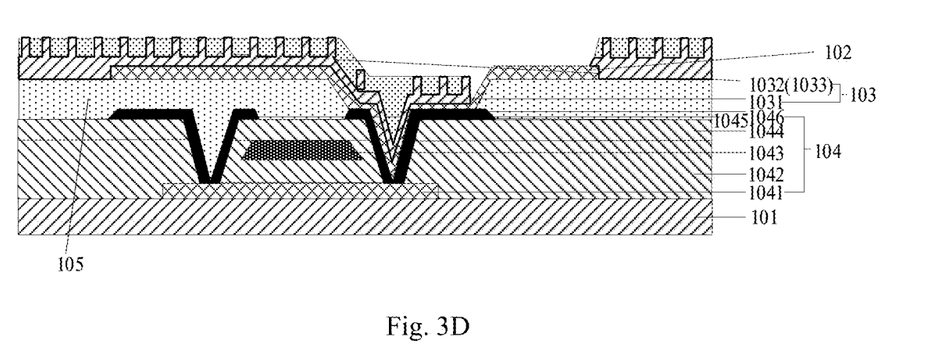

It is to be noted that, as shown in FIG. 3D, the portion of the light-absorbing material on the surface of the transparent polymer layer may be completely removed by using, for example, dry etching of a plasma bombardment process, but the light-absorbing material 1032 in the plurality of micro-pores 1033 will be permanently retained in the transparent polymer layer to form an anti-reflection layer, whereby it can be assured that the anti-reflection layer has good light-blocking performance for the reflective anode, and the ambient light rays can be prevented from being reflected by the reflective anode to the pixel region in the display substrate and hence affecting the display effect.

It is to be understood that after the formation of the anti-reflection layer composed of the transparent polymer layer and the light-absorbing material filling the plurality of micro-pores in the transparent polymer layer, a passivation layer, spacers, an encapsulation layer and other film layers may be continuously formed on the anti-reflection layer using materials and processes in the prior art so as to form the entire display substrate at last.

In some embodiments, the first reactive gas includes carbon tetrafluoride ($CF_4$) and the second reactive gas includes oxygen ($O_2$).

It is to be noted that the surface of the transparent polymer layer may be treated with a gas mixture of the carbon tetrafluoride ($CF_4$) and the oxygen ($O_2$) with the oxygen ($O_2$) acting as the main reactive gas, so as to form the plurality of column-shaped structures (a grass-like structure) or T-shaped structures, that is, the plurality of micro-pores. It is to be understood that the reactive gases vary depending on the material of the transparent polymer layer, and in practical applications, types of the reactive gases may be reasonably selected according to the material of the transparent polymer layer to assure that the plurality of micro-pores having the column-shaped structure or the T-shaped structure are formed on the surface of the transparent polymer layer.

In some embodiments, the ratio of the volumetric flow rate (VFR) of the carbon tetrafluoride ($CF_4$) to that of the oxygen ($O_2$) ranges from 2:1 to 5:1.

Figure 4:
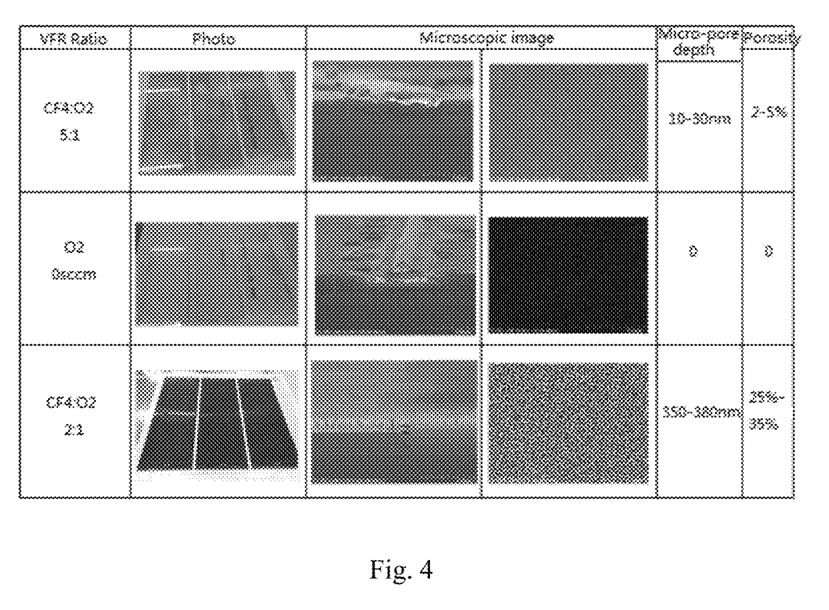
FIG. 4 shows a schematic view of an anti-reflection layer in a display substrate provided in an embodiment of the present disclosure and a specific process of forming the same.

It is to be noted that, as shown in FIG. 4, different ratios of the volumetric flow rate (VFR) of the carbon tetrafluoride ($CF_4$) to that of the oxygen ($O_2$) may result in the column-shaped structures or T-shaped structures of different depths being formed in the surface of the transparent polymer layer. When the ratio of the volumetric flow rate (VFR) of the carbon tetrafluoride ($CF_4$) to that of the oxygen ($O_2$) is 5:1, the depth of each micro-pore thus formed ranges from 10 nanometers to 30 nanometers, and a porosity of the micro-pores ranges from 2% to 5%. When the volumetric flow rate (VFR) of the oxygen ($O_2$) is zero, that is, there is only the carbon tetrafluoride ($CF_4$) in the entire gas mixture, since the oxygen ($O_2$) is the main reactive gas, no micro-pore is formed, that is, the depth of each micro-pore is zero, and the porosity of the micro-pores is also zero. When the ratio of the volumetric flow rate (VFR) of the carbon tetrafluoride ($CF_4$) to that of the oxygen ($O_2$) may be 2:1, the depth of each micro-pore thus formed ranges from 358 nanometers to 380 nanometers, and the porosity of the micro-pores ranges from 25% to 35%. As can be seen, the smaller the ratio of the volumetric flow rate (VFR) of the carbon tetrafluoride ($CF_4$) to that of the oxygen ($O_2$), the higher the concentration of the effective reactive gas oxygen ($O_2$) will be, the deeper the formed micro-pores will be, the higher the porosity of the macro-pores will be, and accordingly, the larger the amount of the light-absorbing material to fill the micro-pores will be. In practical applications, the ratio of the volumetric flow rate (VFR) of the carbon tetrafluoride ($CF_4$) to that of the oxygen ($O_2$) is typically set at 2:1 (e.g., the volumetric flow rate (VFR) of carbon tetrafluoride ($CF_4$) is between 250 sccm and 350 sccm, and that of the oxygen ($O_2$) is between 100 sccm and 200 sccm; in one embodiment, the volumetric flow rate (VFR) of carbon tetrafluoride ($CF_4$) is 300 sccm, and that of the oxygen ($O_2$) is 150 sccm). In this way, the depth of each micro-pore may be controlled in a range from 350 nanometers to 400 nanometers, such that the formed micro-pores may be filled with the light-absorbing material in an amount sufficient to assure that the optical density of the anti-reflection layer is around 1.0, thereby enabling the anti-reflection layer to have good light-absorbing performance and therefore achieving good anti-reflection effects.

It is to be understood that the foregoing embodiments are merely exemplary embodiments for the purpose of illustrating the principles of the present disclosure, and the present disclosure is not limited thereto. Various modifications and improvements can be made by a person skilled in the art without departing from the spirit and essence of the present disclosure. Accordingly, all of the modifications and improvements also fall into the protection scope of the present disclosure.

The invention claimed is:

1. A display substrate having a pixel region and a non-pixel region, the display substrate comprising a base substrate and a first electrode layer on the base substrate, wherein the display substrate further comprises an anti-reflection layer on the first electrode layer, and an orthographic projection of the anti-reflection layer on the base substrate is within the non-pixel region;

the anti-reflection layer comprises a transparent polymer layer and a light-absorbing material; and a surface of the transparent polymer layer away from the base substrate is provided with a plurality of micro-pores, and the plurality of micro-pores are filled with the light-absorbing material;

wherein the display substrate further comprises: a thin-film transistor on the base substrate and a planarization layer on the thin-film transistor;

the thin-film transistor comprises: an active layer, a gate insulation layer, a gate electrode, an interlayer dielectric layer, a source electrode and a drain electrode on the base substrate in this order; the active layer comprises: a first contact region, a second contact region and a channel region between the first contact region and the second contact region; the source electrode and the drain electrode are provided in a same layer and connected to the first contact region and the second contact region of the active layer through a first via and a second via penetrating through the interlayer dielectric layer and the gate insulation layer, respectively; and the planarization layer is between the same layer in which the source electrode and the drain electrode are provided and the first electrode layer, and the first electrode layer is connected to the drain electrode through a third via in the planarization layer.

2. The display substrate according to claim 1, wherein the anti-reflection layer is on a side of the first electrode layer away from the base substrate.

3. The display substrate according to claim 1, wherein a depth of each of the plurality of micro-pores ranges from 350 nanometers to 400 nanometers.

4. The display substrate according to claim 1, wherein a material of the transparent polymer layer comprises a photoresist.

5. The display substrate according to claim 1, wherein the light-absorbing material comprises molybdenum, titanium or aluminum.

6. The display substrate according to claim 1, further comprising: a pixel definition layer on the anti-reflection layer, an organic functional layer on the pixel definition layer within the pixel region, a second electrode layer on the organic functional layer and arranged opposite to the first electrode layer, and an encapsulation layer situated on the second electrode layer.

7. The display substrate according to claim 6, wherein a shape of each of the plurality of micro-pores is a column shape or a T-shape.

8. The display substrate according to claim 7, wherein a portion of the surface of the transparent polymer layer away from the base substrate, which is not provided with the plurality of micro-pores, is not provided with the light-absorbing material.

9. The display substrate according to claim 8, wherein a porosity of the plurality of micro-pores in the transparent polymer layer ranges from 25% to 35%.

10. The display substrate according to claim 1, wherein a shape of each of the plurality of micro-pores is a column shape or a T-shape.

11. The display substrate according to claim 1, wherein a portion of the surface of the transparent polymer layer away from the base substrate, which is not provided with the plurality of micro-pores, is not provided with the light-absorbing material.

12. The display substrate according to claim 1, wherein a porosity of the plurality of micro-pores in the transparent polymer layer ranges from 25% to 35%.

13. A display apparatus, comprising the display substrate according to claim 1.

14. A manufacturing method of the display substrate of claim 1, the manufacturing method comprising:
    forming, by a patterning process, the transparent polymer layer having a preset pattern, on the base substrate where the first electrode layer is formed, such that the orthographic projection of the transparent polymer layer on the base substrate is within the non-pixel region;
    forming the plurality of micro-pores by treating a surface of the transparent polymer layer away from the base substrate with a first reactive gas and a second reactive gas;
    depositing the light-absorbing material on the transparent polymer layer and in the plurality of micro-pores; and
    removing, by an etching process, a portion of the light-absorbing material on the transparent polymer layer to form the anti-reflection layer.

15. The manufacturing method of the display substrate according to claim 14, wherein the first reactive gas comprises carbon tetrafluoride, and the second reactive gas comprises oxygen.

16. The manufacturing method of the display substrate according to claim 15, wherein a ratio of a volumetric flow rate of the carbon tetrafluoride to a volumetric flow rate of the oxygen ranges from 2:1 to 5:1.

17. The manufacturing method of the display substrate according to claim 16, wherein the volumetric flow rate of the carbon tetrafluoride is between 250 sccm and 350 sccm, and the volumetric flow rate of the oxygen is between 100 sccm and 200 sccm.

18. The manufacturing method of the display substrate according to claim 14, further comprising:
    forming, on the anti-reflection layer, a pixel definition layer to define the pixel region;
    forming an organic functional layer on the pixel definition layer and at a position corresponding to the pixel region;
    forming a second electrode layer on the organic functional layer and at a position corresponding to the first electrode layer; and
    forming an encapsulation layer on the second electrode layer.

* * * * *